United States Patent [19]
Sekido et al.

[11] 4,038,586
[45] July 26, 1977

[54] COULOMB MEMORY ELEMENT

[75] Inventors: Satoshi Sekido, Kyoto; Tomohiko Arita, Neyagawa, both of Japan

[73] Assignee: Matsushita Electric Industrial Co., Ltd., Osaka, Japan

[21] Appl. No.: 579,240

[22] Filed: May 20, 1975

Related U.S. Application Data

[63] Continuation of Ser. No. 397,730, Sept. 17, 1973, abandoned.

[30] Foreign Application Priority Data

Sept. 20, 1972  Japan .............................. 47-94766
Sept. 20, 1972  Japan .............................. 47-94767
Mar. 1, 1973  Japan .............................. 48-24889

[51] Int. Cl.$^2$ ............................................. H01G 9/18
[52] U.S. Cl. ................................ 361/435; 252/62.2; 361/433; 361/434
[58] Field of Search ..................... 317/230, 231, 232; 252/62.2

[56] References Cited

U.S. PATENT DOCUMENTS

| | | | |
|---|---|---|---|
| 3,551,755 | 12/1970 | Bode et al. | 317/231 |
| 3,604,985 | 9/1971 | Peck et al. | 357/230 |
| 3,628,103 | 12/1971 | Booe | 317/230 |
| 3,679,945 | 7/1972 | Sekido et al. | 317/230 |

Primary Examiner—William D. Larkins
Attorney, Agent, or Firm—Stevens, Davis, Miller & Mosher

[57] ABSTRACT

A coulomb memory element having an electric current breaking action at a high allowable maximum voltage in which an electrolyte consisting mainly of a lead salt or a mixture of lead salts is charged between one or more inactive electrodes consisting of tungsten or tungsten plated with gold and one or more active electrodes consisting of pure lead which may be dissolved or deposited according to Faraday's law.

2 Claims, 15 Drawing Figures

COULOMB MEMORY ELEMENT

This is a continuation of application Ser. No. 397,330 filed Sept. 17, 1973, now abandoned.

The present invention relates to a coulomb memory element. More particularly, the invention relates to a coulomb memory element in which an electrolyte consisting mainly of a lead salt or a mixture of lead salts is charged between one or more inactive electrodes consisting of tungsten or tungsten plated with gold and one or more active electrodes consisting of lead which is dissolved and deposited according to Faraday's law.

Metals of Cu, Ag, Hg, Pb, etc. are known to be dissolved and deposited electrochemically according to Faraday's law. Various coulomb-meters have heretofore been produced utilizing this phenomenon. In most of the meters, a quantity of electricity has been determined by measuring a change in the weight or volume of the electrode dissolved or deposited. However, if an electrical machine or apparatus is to be controlled by the quantity of electricity, it is desirable to take out a change in quantity of electricity as an electrical signal.

On the other hand, for example, when mercury is charged into a thin glass tube on both sides thereof through a small amount of an electrolyte layer and an electric current is let flow between the thus formed mercury electrodes, the length of the mercury column varies in proportion to the quantity of electricity passed. Therefore, a change in quantity of electricity can be taken out as a change in electrostatic capacity for a leaf electrode around the glass tube. Alternatively, a change in quantity of electricity can be taken out as a change in resistance between two points on the deposited electrode because the thickness of the deposited electrode changes in proportion to quantity of electricity passed when the above-mentioned metal is deposited by electrolysis. The following method for taking out a change in quantity of electricity is more direct and employed in the present invention.

An inactive electrode of, for example, Pt or Au is used as one electrode and Ag is used as another electrode. As an electrolyte, an aqueous solution containing a soluble silver salt or a solid electrolyte such as AgI, AgBr, $Ag_3SI$ or $RbAg_4I_5$ is used. When Ag is deposited on Pt or Au by electrolysis and then an electric current corresponding to the quantity of electricity required for the electrolysis is let flow, Ag is dissolved and then a reaction other than the dissolution of Ag occurs on Pt or Au, resulting in a change in electric potential. It is possible to indicate by this change in electric potential that a definite quantity of electricity flowed. The above-mentioned another reaction which occurs after the dissolution of the deposit is the electrolysis of water when an aqueous solution is used as an electrolyte and is the electrolysis of a solid electrolyte when the solid electrolyte is used as an electrolyte. This reacton causes the generation of a gas or various obstacles by the reaction products. Therefore, it is necessary for the electric potential to be 1.0 volt or less for an aqueous solution and 0.6 volt or less for a solid electrolyte. Also, it is necessary to provide a protective circuit to maintain such a low voltage and amplify the electric current for the control.

The present invention provides a coulomb memory element having an electric current breaking action at a higher allowable maximum voltage than prior art elements in which tungsten or tungsten plated with gold to afford an active point is used as an inactive electrode, lead is used as an active electrode, and an aqueous solution containing mainly lead silicofluoride or lead borofluoride is used as an electrolyte.

The present invention will be explained in more detail referring to the accompanying drawings in which:

FIGS. 14(a) and (b) show exemplary circuits when the above-mentioned element is used for the integration of signals more than or less than the threshold value, respectively.

Figure 1:
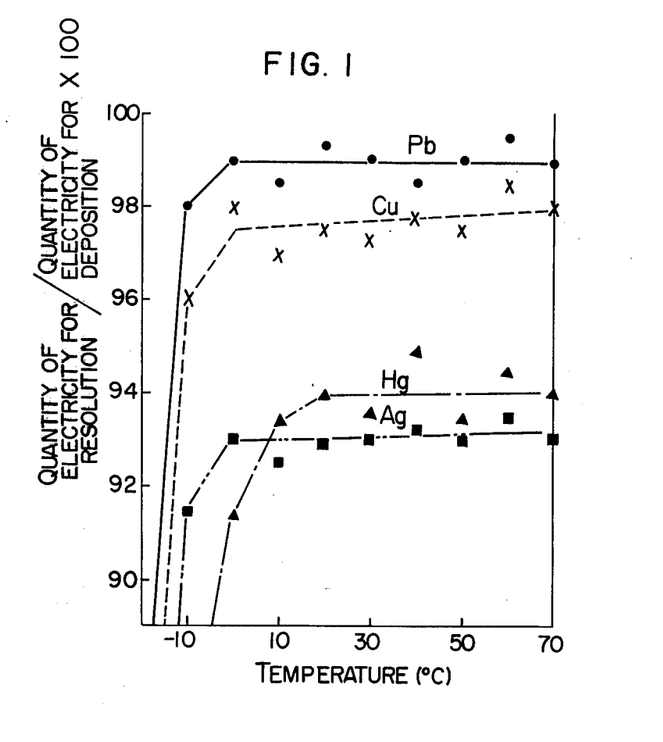
FIG. 1 shows the characteristic curves for elements consisting of combinations of tungsten and various soluble electrodes in which a relationship between temperature and a ratio of deposition to dissolution (efficiency) is shown.

Oxides of valve metals such as Mo, Ti, Ta, Nb or W are known to have rectifying action. Among them, tungsten reaches a metallicaly stable state at the most noble potential (at pH 1 and $-0.178$ V or less). On the other hand, lead is deposited at the least noble potential (at about $-0.095$ V or less at the solution composition of the present invention) among the metals which may be dissolved or deposited in an aqueous solution thereof according to Faraday's law. It means that the oxidized film on tungsten may be probably partially reduced on electrodeposition. FIG. 1 shows a relationship between temperature and efficiency when electrodeposition-dissolution was carried out at 1 mA for one hour by the use of a combination of W and Ag, Cu, Pb or Hg. The composition of the electrolyte used was as follows:

$Ag_3(PO_4)$ 90 g/l, $H_3PO_4$ 900 g/l in case of Ag;
$HgI_2$ 225 g/l, KI 750 g/l in case of Hg;
$Cu(BF_4)_2$ 350 g/l, $HBF_4$ 50 g/l in case of Cu; and
$Pb(BF_4)_2$ 300 g/l, $PbSiF_6$ 700 g/l in case of Pb.

Figure 2:
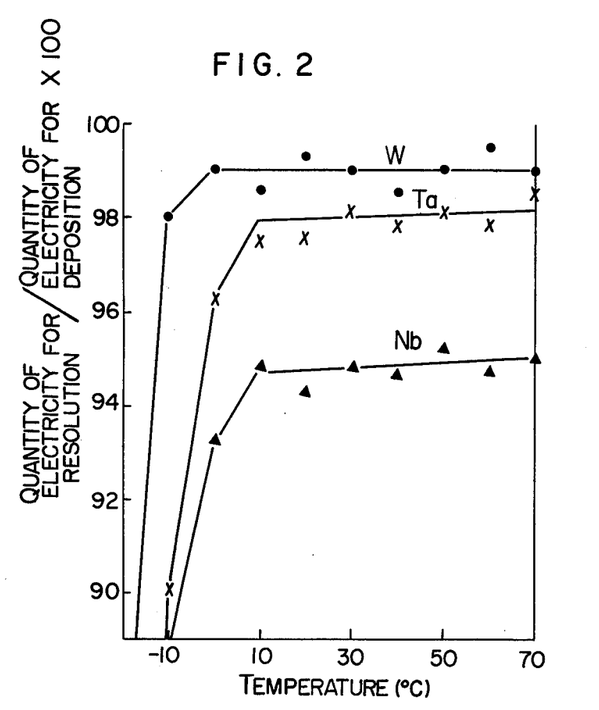
FIG. 2 shows the characteristic curves for elements consisting of combinations of lead and various inactive electrodes in which a relationship between temperature and a ratio of deposition to dissolution (efficiency) is shown.

FIG. 2 shows a relationship between temperature and efficiency in a combination of Pb and Nb, Ta or W. The conditions were the same as in FIG. 1. It is clear from these figures that the use of a combination of W and Pb may broaden the range of temperature used. Particularly, it is considered to be mainly due to the oxidized film formed on the valve metal that efficiency at low temperatures changes, but the fineness and uniformity of the film also depend on the kind of an anion in the electrolyte.

Figure 3:
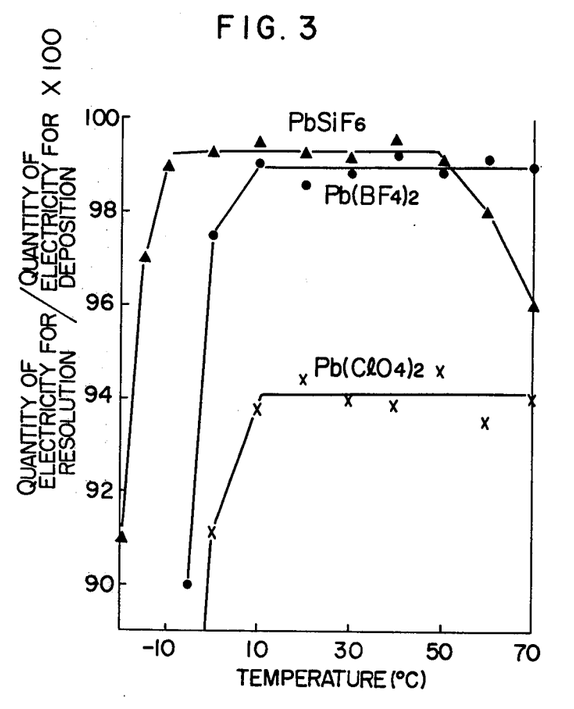
FIG. 3 shows the characteristic curves for elements using aqueous solutions of various lead salts as an electrolyte in which a relationship between temperature and a ratio of deposition to dissolution (efficiency) is shown.
Figure 4:
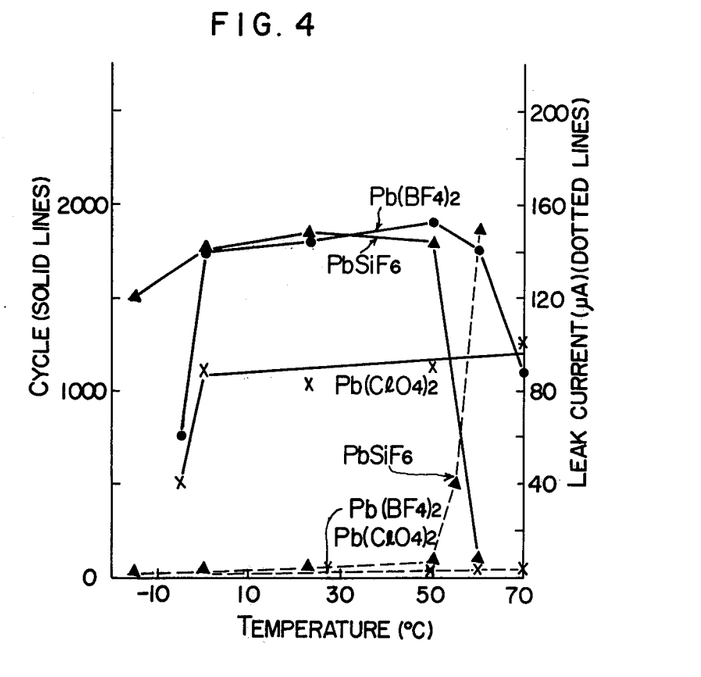
FIG. 4 shows life cycles and leak currents at the break of current at various temperatures when aqueous solutions of various lead salts are used as an electrolyte.
Figure 5:
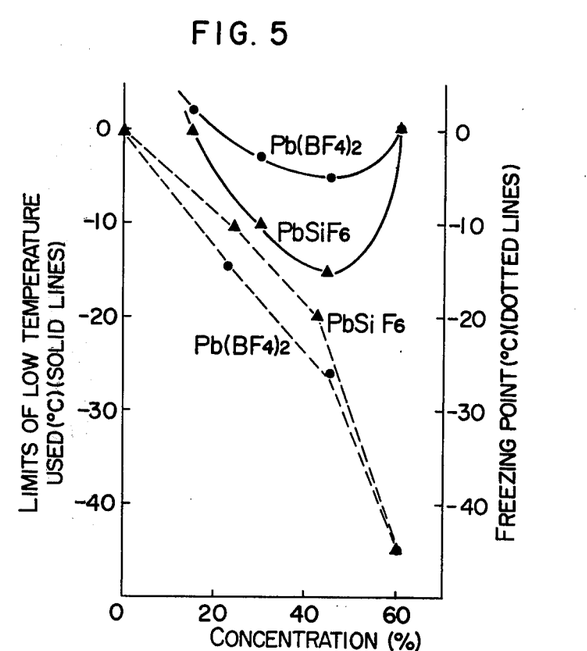
FIG. 5 shows a relationship between the concentration of an aqueous lead salt solution used as an electrolyte and melting point and the limit of low temperature used.

FIG. 3 shows the change of efficiency with temperature when electrodeposition-dissolution was carried out at 3 mA for 1 hour by the use of a 45% solution of $Pb(ClO_4)_2$, $Pb(BF_4)_2$ or $PbSiF_6$ as an electrolyte. $PbSiF_6$ showed the best low temperature characteristic, and $Pb(BF_4)_2$ and $Pb(ClO_4)_2$ followed this in the order. Maximum voltage at the break of current was 10 V, but the appearance of the oxide showed large rhombic holes in the case of $PbSiF_6$, showed many small round holes in the case of $Pb(BF_4)_2$ and was smooth, uniform and free of hole in the case of $Pb(ClO_4)_2$. Also, life and leak current (at a voltage applied at the break of current of 10 V) at each temperature are shown in FIG. 4. $PbSiF_6$, which is reported to decompose thermally at 55° C, gave short life and a large leak current. A relationship between the concentration of these salts and melting point and limit of low temperature used is shown in FIG. 5. In the case of both $Pb(BF_4)_2$ and $PbSiF_6$, a concentration of 45% was most desirable.

Figure 6:
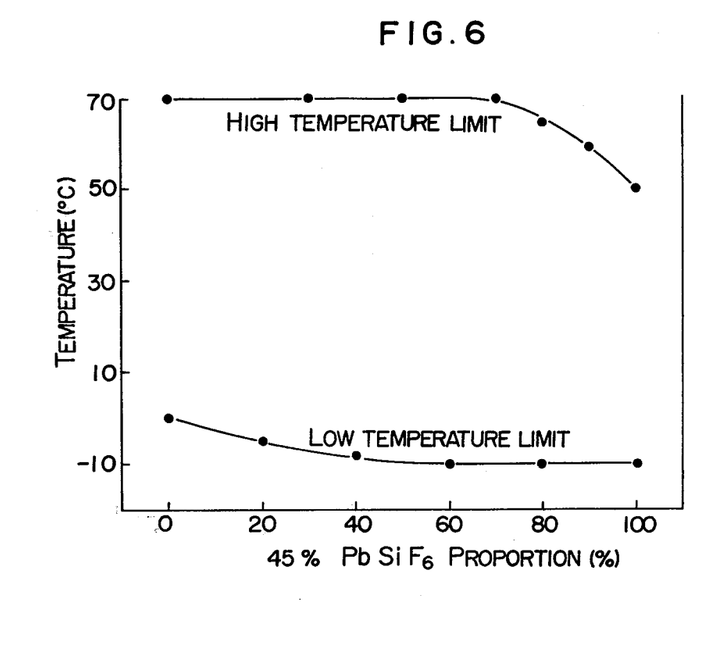
FIG. 6 shows a relationship between a ratio of 45% $PbSiF_6$ to $Pb(BF_4)_2$ in an electrolyte and the limit of temperature used.

$Pb(BF_4)_2$ efficiently acts at higher temperatures while $PbSiF_6$ efficiently acts at lower temperatures. FIG. 6 shows the effect of a mixture of $Pb(BF_4)_2$ and 45% $PbSiF_6$. The lower temperature limit was determined as a point where efficiency dropped below 96% and the higher temperature limit was determined as a point where an increase in leak current at the break of current and the reduction of life occurred. A 7 : 3 $PbSiF_6$ - $Pb(BF_4)_2$ mixture was considered to give a comparatively broad range of temperature used. The addition of an acid is generally recommended in a lead plating bath, but it is not recommended in this case because it deteriorates efficiency and life.

Figure 7:
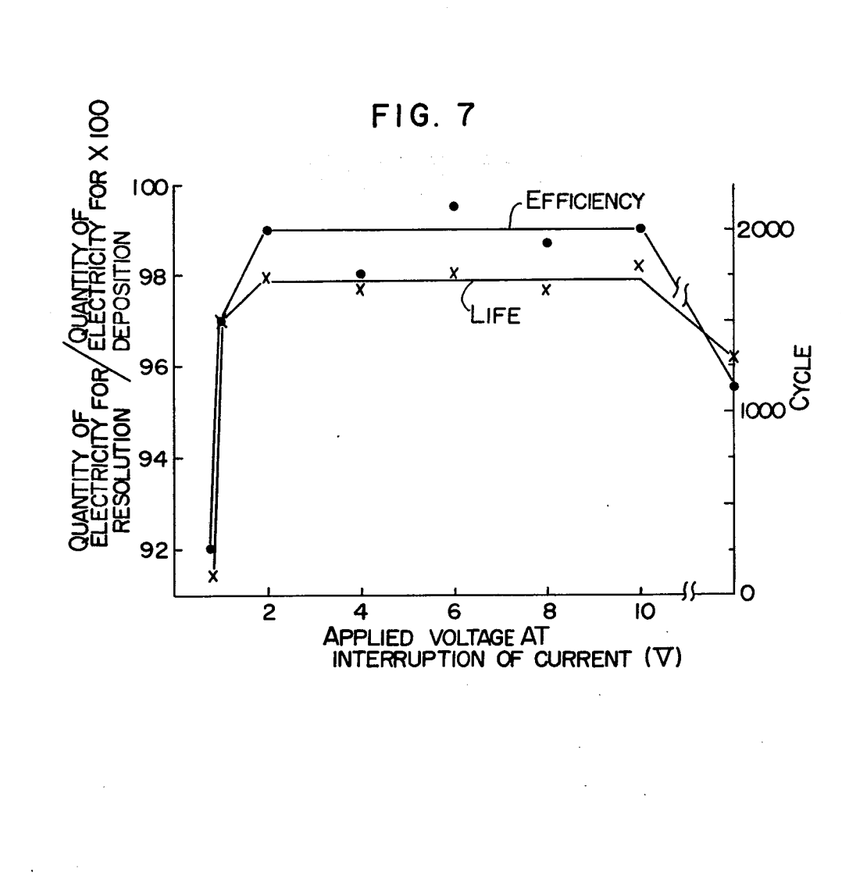
FIG. 7 shows a relationship between maximum voltage at the break of current and efficiency and life.

A change in efficiency and life with maximum voltage at the break of current in electrodepositiondissolution at room temperature and a 1 mA for one hour is shown in FIG. 7. Regarding efficiency and life, the voltage of 1 - 10 V is desirable. This range is wide and characterized in that it has an electric current breaking action but there is no fear of the generation of a gas.

Thus, a tungsten electrode is characterized in that it has an electric current breaking action and a voltage at the break of current can be high, but has a defect that the range of low temperature used is narrow. It is due to the fact that the film formed on tungsten at a low temperature is stabilized. It can be prevented only be increasing the number of active points by carrying out gold plating. The gold plating should not fall off on repeated dissolution-deposition. Therefore, it is necessary that (i) the plating is carried out after the oxide is formed on tungsten has been sufficiently removed and (ii) the lateral growth of the gold plating layer is taken into consideration. It is necessary for (i) to carry out the plating at such a high pH as the tungsten oxide may not be formed. Regarding (ii), the current density, time and temperature of the plating become a problem.

The plating of tungsten with gold is carried out as follows:

Tungsten is first dipped in 20 g/l of sodium hydroxide and subjected to anode polishing at 30 V for 5 - 10 minutes. Thereafter, it is dipped in 30 g/l of potassium hydroxide and subjected to anode etching at 3 - 5 mA for one minute. The thus treated tungsten is then subjected to gold plating. Thus, after the anode etching, the electrode is dipped in a mixture of 10 g/l of $KAu(CN)_2$, 90 g/l of KCN and 30 g/l of KOH and a current of 75 μA is applied at 20° - 40° C for 1 - 20 minutes. Thus, tungsten is plated with gold.

Figure 8:
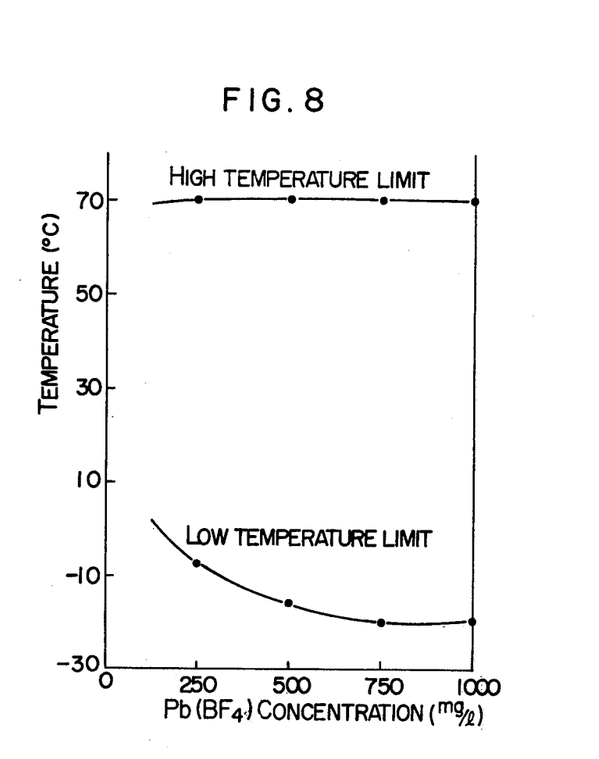
FIG. 8 shows a relationship between $Pb(BF_4)_2$ concentration of an electrolyte and the range of temperature used in a gold-plated element.
Figure 9:
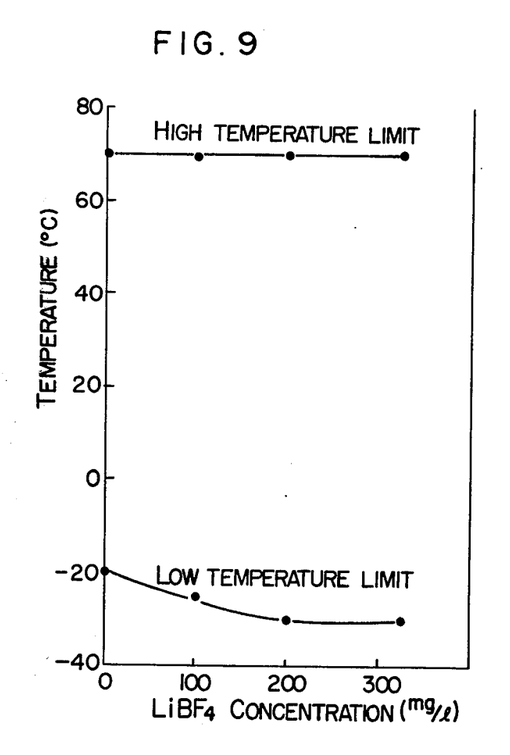
FIG. 9 shows a change in the range of temperature used when $LiBF_4 \cdot 2H_2O$ is added to a $Pb(BF_4)_2$ solution in a gold-plated element.

In the composition of an electrolyte for gold plating, it is unnecessary to consider the effect of an anion. FIG. 8 shows a relationship between a $Pb(BF_4)_2$ concentration and the range of temperature used. FIG. 9 shows the range of temperature used when $LiBF_4·2H_2O$ was added to 1000 g/l of $Pb(BF_4)_2$, which was obtained as a point where the efficiency of dissolutiondeposition at 1 mA for 1 hour dropped below 96%. Also, the addition of 300 - 450 g/l of $Li_2SIF_6$ or 250 - 400 g/l of $LiBF_4·2H_2O$ to 600 - 800 g/l of $PbSiF_6$ in place of the addition of $LiBF_4·2H_2O$ to $Pb(BF_4)_2$ can extend the range of low temperature used.

The area of an inactive electrode is closely related to the growth of lead crystals on electrodeposition. It should be avoided that the current density exceeds 60 $mA/cm^2$, since it causes dendrite deposition and accelerates short-circuit. All the inactive electrodes in the examples as described below had such an area as gave a current density of 60 $mA/cm^2$ or less.

The following examples illustrate the present invention. In the examples, the constructions and uses of cells having different numbers of electrodes are explained.

EXAMPLE 1

Diode structure comprising one inactive electrode and one active electrode

Figure 10:
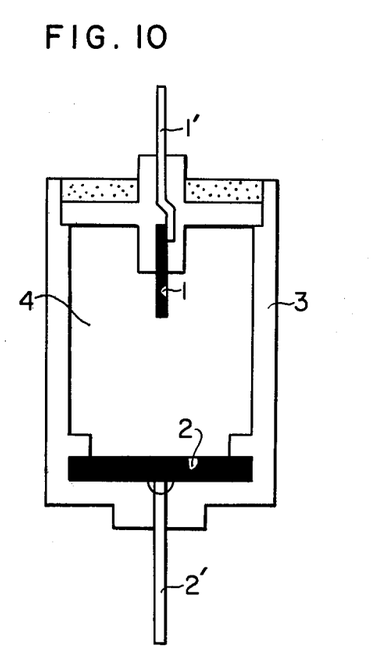
FIG. 10 is a sectional view of a diode coulomb memory element according to the present invention comprising an inactive electrode and a lead electrode.
Figure 11:
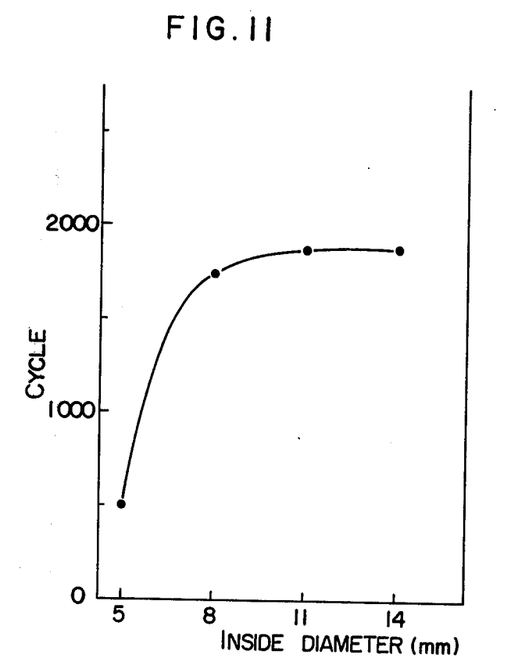
FIG. 11 shows a relationship between the inside diameter of an electrolytic cell and life cycle in the diode element as shown in FIG. 10.

A recommended structure is shown in FIG. 10, in which 1 is an inactive electrode consisting of tungsten or tungsten plated with gold. In an element of maximum current of 3 mA, the electrode has a diameter of 0.5 mm and a length of 3 mm. An active electrode 2 consists of pure lead and is installed on molding as part of an electrolytic cell 3 of polypropylene which is resistant to an electrolyte. The reason why the active electrode 2 is installed at the bottom of the cell is to avoid the short-circuit by the falling off of the electrode which is usually used sideways. The diameter of the cell 3 is related to life. FIG. 11 shows a relationship between the inside diameter of the cell and life, that is, the number of electrodeposition-dissolution cycles at 3 mA for 3 hours repeated. 4 is an electrolyte which consisted of a 7 : 3 mixture of 45% $PbSiF_6$ and $Pb(BF_4)_2$ for a W electrode or a solution of 325 mg/l of $LiBF_4·2H_2O$ in 45% $Pb(BF_4)_2$ for a W-Au electrode. In such a diode element, a current which is equal to the quantity of electricity passed to the inactive electrode as a cathode can be let flow in the opposite direction. Therefore, it can be used as an integrating element such as for inspection of a meter for electricity, city gas, city water, etc. or a battery charger or as a timing element such as various timers.

EXAMPLE 2

Figure 12:
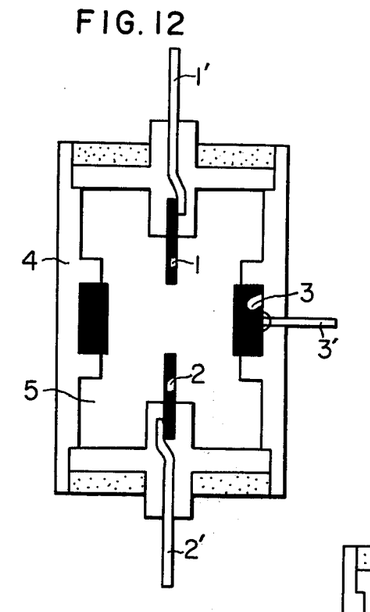
FIG. 12 is a sectional view of a triode coulomb memory element according to the present invention comprising two inactive electrodes and a lead electrode.

Triode structure comprising two inactive electrodes and one active electrode A recommended structure is shown in FIG. 12, in which 1 and 2 are inactive electrodes consisting of tungsten or tungsten plated with gold. In an element of a maximum current of 3 mA, the electrodes have a diameter of 0.5 mm and a length of 3 mm. 3 is an active electrode consisting of pure lead, which is installed on molding as part of the electrolytic cell 4 resistant to an electrolyte, and is in the form of a ring of an inside diameter of 8 mm and a length of 5 mm. 5 is an electrolyte. In the element, if an electric current has previously been passed between one of the inactive electrodes 1 and the electrode 3 to deposit Pb electrically, it is possible to pass a definite quantity of electricity back and forth between the electrodes 1 and 2. Therefore, the element is suitable as a repeated timer or for the use as an encoder.

EXAMPLE 3

Figure 13:
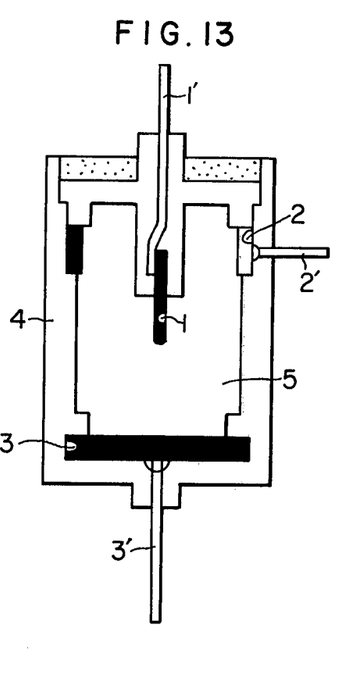
FIG. 13 is a sectional view of a triode coulomb memory element according to the present invention comprising an inactive electrode and two lead electrodes.
Figure 14:
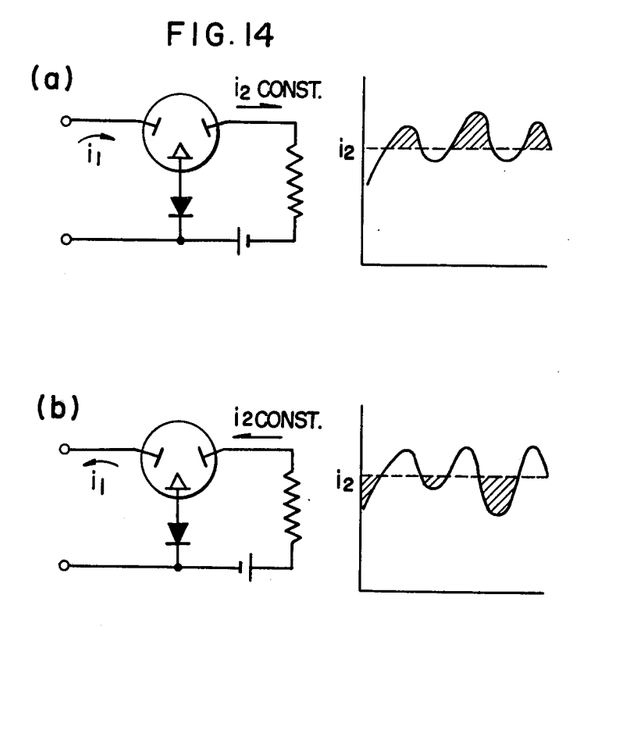

Triode structure comprising one inactive electrode and two active electrodes A recommended structure is shown in FIG. 13, in which 1 is an inactive electrode consisting of tungsten or tungsten pated with gold which is positioned substantially at the center of an electrolytic cell 4. 2 and 3 are active electrodes consisting of pure lead which are installed on molding as part of the electrolytic cell 4 at the upper and lower parts of the cell avoiding the environment of the active electrode 1 and are in the form of a ring of an inside diameter of 8 mm and a length of 5 mm. The reason why the environment of the inactive electrode 1 is avoided is to avoid short-circuit by the falling off of the electrodes which are usually used sideways. 5 is an electrolyte. This element is suitable for the integration of signals above a threshold value or the integration of signals below the threshold value, and the addition and substraction of the two signals are also possible. In a circuit of FIG. 14, if a definite electric current is passed between the electrodes 1 and 3 and signals are entered between the electrodes 1 and 2 in the opposite direction, the former will become a threshold value and electric currents above or below the threshold value will be integrated.

What is claimed is:

1. A coulomb memory element comprising an electrolyte consisting of an aqueous solution selected from the group consisting of lead silicofluoride ($PbSiF_6$), lead borofluoride ($Pb(BF_4)_2$) and mixtures thereof, having added thereto a member selected from the group consisting of lithium silicofluoride and lithium borofluoride; at least one inactive electrode consisting essentially of tungsten plated with gold; and at least one active electrode consisting essentially of lead, said electrolyte being charged between said inactive and active electrodes and said active electrode being dissolved or deposited according to Faraday's law.

2. A coulomb memory element according to claim 1, wherein the electrolyte is an aqueous solution containing 600 – 800 g/l of lead silicofluoride or lead borofluoride and 250 – 450 g/l of lithium silicofluoride or lithium borofluoride.

* * * * *